(12) United States Patent
Hein

(10) Patent No.: US 7,180,017 B2
(45) Date of Patent: Feb. 20, 2007

(54) INTEGRATED CENTER STACK SWITCH BANK FOR MOTOR VEHICLE

(75) Inventor: David A. Hein, Sterling Heights, MI (US)

(73) Assignee: Lear Corporation, Southfield, MI (US)

(*) Notice: Subject to any disclaimer, the term of this patent is extended or adjusted under 35 U.S.C. 154(b) by 150 days.

(21) Appl. No.: 10/744,163

(22) Filed: Dec. 22, 2003

(65) Prior Publication Data

US 2005/0133347 A1 Jun. 23, 2005

(51) Int. Cl.
H01H 9/00 (2006.01)

(52) U.S. Cl. .................. 200/5 R; 200/600; 200/310; 200/512

(58) Field of Classification Search .......... 200/5 R, 200/600, 310

See application file for complete search history.

(56) References Cited

U.S. PATENT DOCUMENTS

| 4,022,296 A | 5/1977 | Mandel et al. |
|---|---|---|
| 4,233,522 A * | 11/1980 | Grummer et al. ............ 341/33 |
| 4,340,813 A * | 7/1982 | Sauer ..................... 250/221 |
| 4,379,287 A * | 4/1983 | Tyler et al. ................ 341/33 |
| 4,495,651 A | 1/1985 | Froeliger |
| 4,562,315 A | 12/1985 | Aufderheide |
| 5,512,718 A | 4/1996 | Larose |
| 5,594,222 A | 1/1997 | Caldwell |
| 5,983,146 A | 11/1999 | Sarbach |
| 6,061,446 A | 5/2000 | Lester et al. |
| 6,175,782 B1 * | 1/2001 | Obradovich et al. ............ 701/1 |
| 6,198,206 B1 | 3/2001 | Saarmaa et al. |
| 6,310,611 B1 | 10/2001 | Caldwell |
| 6,320,282 B1 | 11/2001 | Caldwell |
| 6,474,688 B1 | 11/2002 | Bogren et al. |
| 6,529,125 B1 * | 3/2003 | Butler et al. ............... 340/461 |
| 6,819,990 B2 | 11/2004 | Ichinose |
| 6,822,635 B2 * | 11/2004 | Shahoian et al. ........... 345/156 |
| 6,917,693 B1 | 7/2005 | Kirdena et al. |
| 2002/0025837 A1 * | 2/2002 | Levy ..................... 455/566 |
| 2002/0033795 A1 * | 3/2002 | Shahoian et al. ........... 345/156 |
| 2002/0057020 A1 | 5/2002 | Caldwell |
| 2003/0095095 A1 | 5/2003 | Robbin et al. |
| 2003/0102037 A1 | 6/2003 | Parsons |
| 2003/0121767 A1 | 7/2003 | Caldwell |
| 2005/0035951 A1 | 2/2005 | Bjorkengren |

FOREIGN PATENT DOCUMENTS

| EP | 1101654 | 5/2001 |
|---|---|---|
| EP | 1501007 | 1/2005 |
| WO | WO 00/34068 | 6/2000 |
| WO | WO 02/37516 | 5/2002 |

* cited by examiner

*Primary Examiner*—K. Lee
(74) *Attorney, Agent, or Firm*—MacMillan, Sobanski & Todd, LLC

(57) ABSTRACT

An interface is in the form of a switch bank for the center stack of a motor vehicle. The switch bank comprises a motor vehicle interior trim component and at least one non-movable switch located behind the interior trim component. The switch is operable to actuate and de-actuate an electrically operated device of the motor vehicle.

19 Claims, 4 Drawing Sheets

INTEGRATED CENTER STACK SWITCH BANK FOR MOTOR VEHICLE

BACKGROUND OF INVENTION

This invention relates in general to motor vehicles and more particularly to an interface for controlling operations of a motor vehicle. Most particularly, the invention relates to a center stack switch bank for motor vehicles.

A conventional interface for a motor vehicle typically includes a switch bank, which generally comprises a large number of switches that are mounted in and around the armrests, console, and/or dashboard of the motor vehicle. Certain switch banks are typically located forward and between the driver and front passenger of the motor vehicle in an interior trim component that is commonly referred to as a "center stack". The center stack generally contains switches for controlling the motor vehicle entertainment system and climate control functions. By filling the center stack with the sound system and climate control switches of the motor vehicle, the area ahead of the driver and front passenger is left bare.

A conventional center stack has mechanical switches, which have physically moving (e.g., sliding) parts that create contact between conductors. Openings are provided in the center stack for receiving the switches. The openings commonly attract dust and dirt. This dust and dirt is difficult reach. Consequently, the center stack is difficult to clean.

The physical characteristics of the switches usually occupy space (i.e., usually about 0.5 to 5 mm) for the mechanical movement of the switches. This limits the ability to style and craft the center stack. The switches are also subject to wear and mechanical breakdown due to the moving parts of the switches and thus may become unreliable.

The requirement for the switch openings in center stack requires increased cut lines during the production of the center stack and the unique character of each of the switches requires an increased parts count.

What is needed is a highly-reliable interface with non-moving switches that is easy to use and that increases the ability to style and craft an attractive, easy-to-clean, environmentally protected center stack while reducing cut lines and total parts count.

SUMMARY OF INVENTION

The present invention is directed towards an interface that meets the foregoing needs. The interface is in the form of a switch bank for a center stack of a motor vehicle. The switch bank comprises a motor vehicle interior trim component and at least one non-movable switch located behind the interior trim component. The switch is operable to actuate and de-actuate an electrically operated device of the motor vehicle.

Various objects and advantages of this invention will become apparent to those skilled in the art from the following detailed description of the preferred embodiment, when read in light of the accompanying drawings.

DETAILED DESCRIPTION

Figure 1:
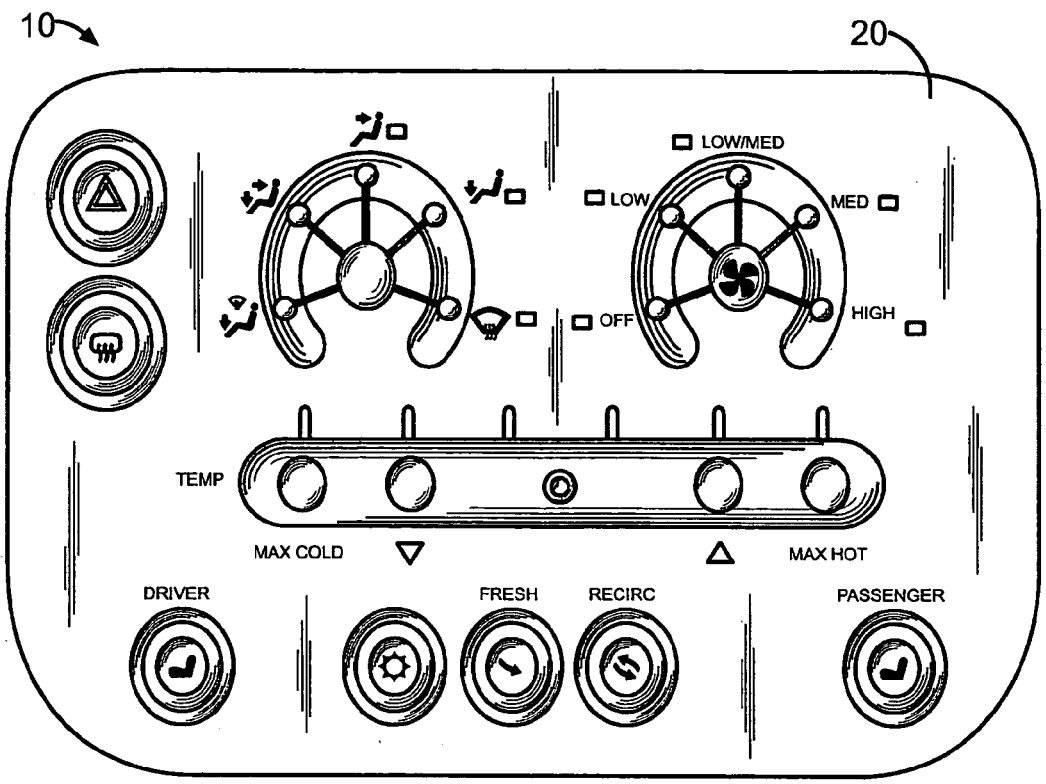
FIG. 1 is a front elevational view of a motor vehicle center stack switch bank according to a preferred embodiment of the invention.

Referring now to the drawings, there is illustrated in FIG. 1 an interface in the form of a switch bank, generally indicate at 10, that is adapted to be integrated in the center stack of the motor vehicle. The switch bank 10 comprises a switch or switch array, which is a number of switches, that is operable to actuate and de-actuate one or more electrically operated devices (not shown) of the motor vehicle, such as the driver's and passenger's heated seats, hazard flashers, rear defogger, and climate control system of the motor vehicle.

The switch bank 10 is preferably made of a material, such as a plastic-based material, that is molded or otherwise crafted as desired to produce a substantially rigid structure having a desired style. The molding of motor vehicle interior trim components is well known to those of ordinary skill in the art of the invention and thus will not be described in further detail.

The switch bank 10 is preferably molded in a single piece, having unitary construction, and preferably having no openings, at least where switches are located, for collecting dust and dirt and thus is relatively easy to wash or otherwise keep clean.

The switch bank 10 may be substantially flat or non-ornamental in style or have tactile features, such as, for example, deformations, such as raised areas, depressed areas, or both raised and depressed areas, to permit a user to easily locate the switches.

Figure 2:
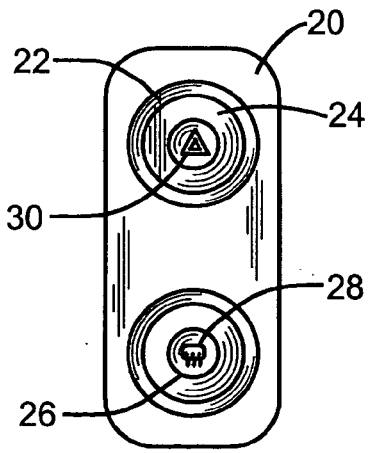
FIG. 2 is an enlarged front elevational view of a portion of the center stack switch bank shown in FIG. 1 showing hazard flasher and rear defogger switches.

The switch bank 10 according to the present invention may be supported by a trim bezel, face plate or fascia 20, which preferably has a tactile identifier 22, such as the trough or mote shown in FIG. 2, to provide an appearance of a switch, such as the rear defogger and hazard flasher switches shown, and visually identify or define the location of such switches. Other switches, such as the driver's and the passenger's heated seats and the climate control switches, may be formed in a similar manner. A tactile guide 24 may be provided within and concentric to the tactile identifier 22. The tactile guide 24 is preferably in the form of a crown, in contrast to the trough or mote described above. The profile of the tactile guide 24 preferably does not exceed the profile of the fascia 20. A target or target area 26 is located within the tactile guide 24 and is preferably in the form of a dimple, cavity or like depression, in contrast to the crown which forms the tactile guide 24. The dissimilar topographies of the fascia 20 allow the user to visually identify the location of the switch and a sensitive operating portion or region (i.e., the target area 26) of the switch for actuating and de-actuating different electrically operated devices (not shown) when the switch is operated by a user. In accordance with a preferred embodiment of the invention, the switch bank 10, or at least portions thereof where switches are located, may be transparent or translucent and back-lit, as will be described in greater detail hereinbelow, to enable the user to visually identify the location of the switches when operating the motor vehicle in the dark. Moreover, the switches may carry indicia 28, 30, such as the standard rear defogger and hazard flasher switch identification symbols shown, to allow the user to easily associate the switches with the devices the switches operate.

Figure 3:
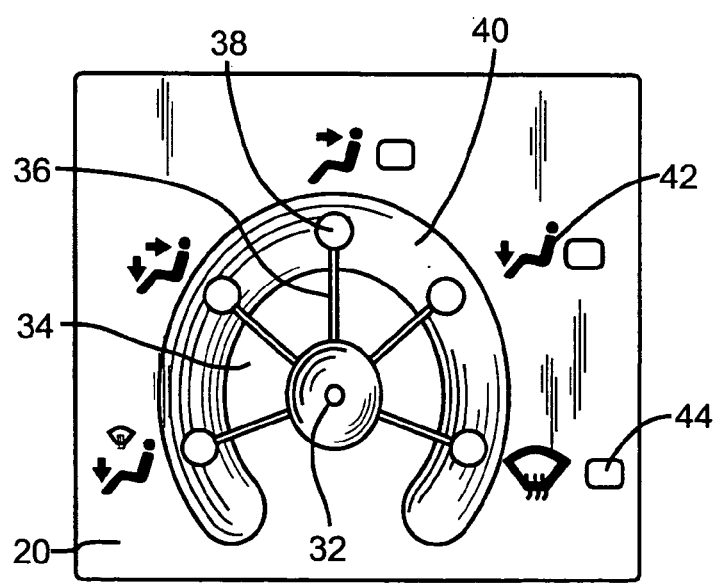
FIG. 3 is an enlarged front elevational view of a portion of the center stack switch bank shown in FIG. 1 showing a vent switch array of the motor vehicle climate control.

The fascia 20 may further be provided with a tactile identifier 32 in the form of a protruding member, similar in shape to an adjustment knob, for identifying a home position or starting point for a switch array, such as the vent switch array shown in FIG. 3, for controlling the function or operation of an electrically operated device, such as the vents of the motor vehicle climate control system. A tactile guide 34, such as the crown shown, may be formed about the tactile identifier 32 to guide the user to the tactile identifier 32. The profile of the tactile guide 34 preferably does not exceed the profile of the fascia 20. Extending from the tactile identifier 32 are spokes or veins 36 that may be provided to guide the user to various targets or target areas 38. In the illustrated embodiment, the target areas 38 are dimples that function to provide a tactile sensation when encountered by the user. The target areas 38 may be located within an auxiliary tactile guide 40, which may be provided about and concentric to the tactile identifier 32 and the tactile guide 34. The target areas 38 identify the sensitive operating portions or regions of the switches in the switch array that actuate and de-actuate the electrically operated device when the switch is operated by the user. The switch bank 10, or at least portions thereof where switches are located, may be transparent or translucent and back-lit to enable the user to visually identify the location of the switches when the motor vehicle is operated in the dark. Moreover, the switch bank 10 may carry indicia 42, such as the standard vent identification symbols shown, to allow the user to easily associate the switches with the devices the switches operate. Furthermore, the switch bank 10 may have areas 44 associated with each target area 38 that are transparent or that otherwise permit indicators 40, such as light emitting diodes (LED) (not shown), to be viewed when the switches associated with corresponding areas 44 are operated. Other switch arrays, such as the fan motor speed control switch array shown in FIG. 1, may be formed in a similar manner to the vent control switch array described above.

Figure 4:
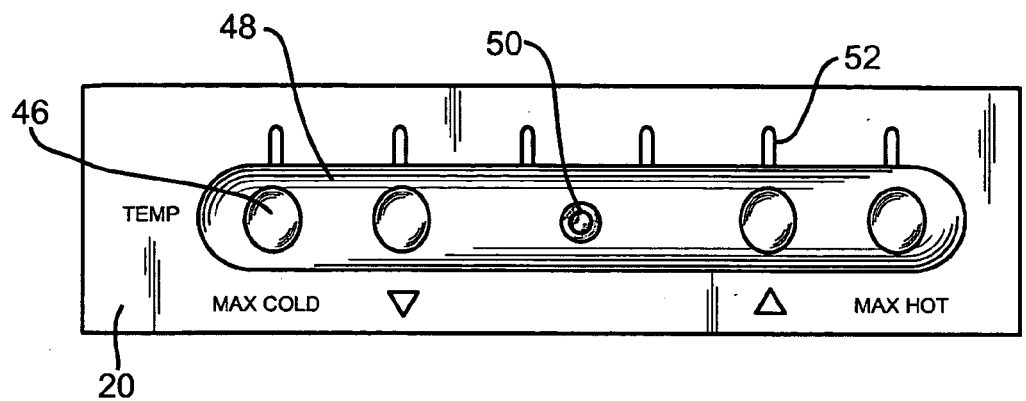
FIG. 4 is an enlarged front elevational view of a portion of the center stack switch bank shown in FIG. 1 showing a temperature control switch array of the motor vehicle climate control.

Another example of a switch array is illustrated in FIG. 4. This switch array is suitable for use as the temperature control switch array of the motor vehicle climate control system. In accordance with a preferred embodiment of the invention, the fascia 20 may have therein a tactile identifier 46, such as the relief shown. A plurality of target or target area 48, such as the dimples, cavities or like depressions shown, may be located within the tactile identifier 46. A tactile guide 50, such as the raised button shown, may be located within the tactile identifier 44, preferably in the axial center of the tactile identifier 46 and equidistantly between opposing target areas 48 to function as a home position for the switch array. The illustrated switch array has switches associated with outer axial target areas 48 that cause the operating temperature of the motor vehicle climate control system to operate at maximum cold and hot temperatures. Switches associated with inner axial target areas 48, when operated cause incremental changes in the operating temperature of the of the motor vehicle climate control system. The switch array may have areas 52 that are transparent or that otherwise permit an indicator, such as an LED (not shown), to be viewed when certain conditions are met. For example, the areas 52 may be color-coded. In accordance with known standards, areas 52 associated with cooler thermostatic temperatures may be blue while areas 52 associated with warmer thermostatic temperatures may be red.

Figure 5:
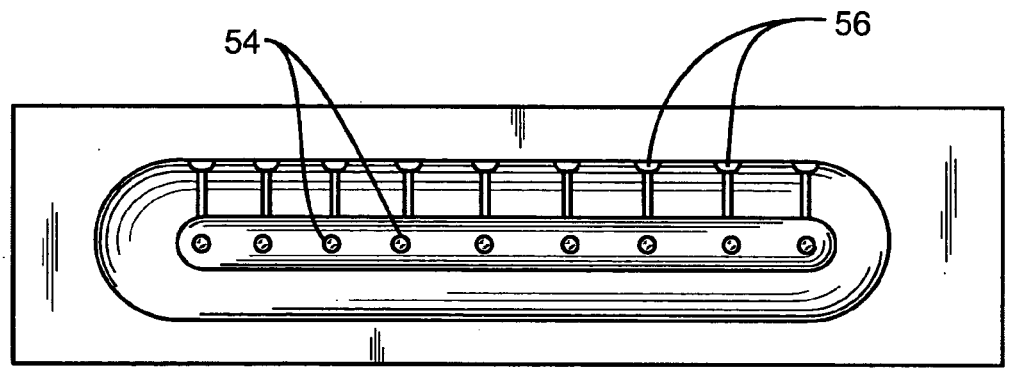
FIG. 5 is a partially cutaway front elevational view of alternative temperature control switch array.

Another example of a switch array is illustrated in a partially cutaway view in FIG. 5. This switch array is suitable for use as the temperature control switch array of a motor vehicle climate control system as well. In accordance with this embodiment of the invention, a plurality of target areas 54 is provided for more discrete control of the climate control system. Each target area 54 has associated therewith a switch and an associated indicator 56, such as an LED (not shown), which provide a visual indication when the switch associated therewith is operated. The indicators 56 associated with the switches causing the climate control system to operate at cooler temperatures may be blue and the indicators 56 associated with the switches causing the climate control system to operate at warmer temperatures may be red.

Figure 6:
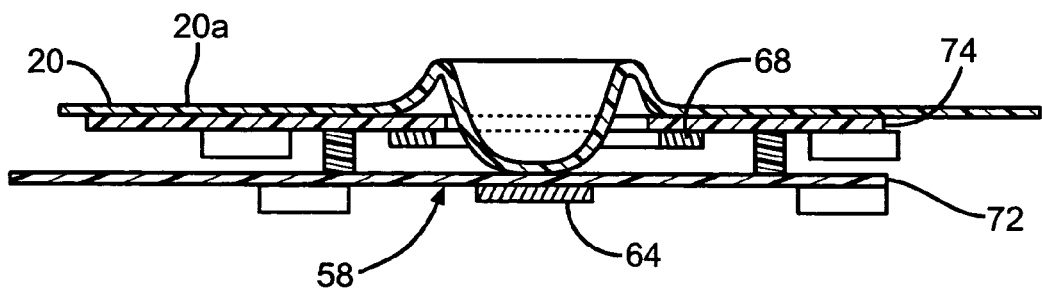
FIG. 6 is a cross-sectional view in plan of a non-movable switch that is adapted for use with the motor vehicle center stack switch bank.

In accordance with the present invention, the switches are non-mechanical or non-movable touch cells or switches, such as, but not limited to, resistive, inductive, piezoelectric and capacitive switches. A capacitive switch that is suitable for carrying out the invention is shown at 58 in FIG. 6. The switch 58 may be of the type described, for example, in U.S. Patent Application Publication No. 2002/0057020, published May 16, 2002, the description of which is incorporated herein by reference. The fascia 20 may be in the form of a substantially rigid substrate having a front surface 20a, which may form a part of the center stack of the motor vehicle and may be decorated and contoured for switches. The switch 58 may include one or more independent dielectric substances, which may support one or more electrodes and one or more electrical components (i.e., one or more resistors, capacitors, and/or integrated circuit chips). In the illustrated embodiment, a first one of the dielectric substances may support at least a first electrode 64. A second one of the dielectric substances may support at least a second electrode 68. One or more electrical components may be supported by either dielectric substance, or by a separate component. The first and second electrodes 64, 68 are associated with a touch sensor, which is cooperatively formed by the dielectric substances, the electrodes 64, 68, and the electrical components. The electrodes 64, 68 are preferably separated to provide three-dimensional separation therebetween. In the illustrated embodiment, the first and second dielectric substances are defined by first and second printed circuit boards 72, 74. The first and second printed circuit boards 72, 74 are spaced apart to provide the preferred three-dimensional separation. Due to the three-dimensional separation of the electrodes 64, 68, the second electrode 68 forms a background capacitive sensor for detecting ambient conditions and, to a lesser extent, external disturbances while the first electrode 64 forms a capacitive sensor that detects both detecting ambient conditions and external disturbances but has a greater coupling to the external disturbances. This construction provides an accurate detection of external disturbances when a stimulus (i.e., a touch input) is placed between the first and second electrodes 64, 68 and, more so, in greater proximity to the first electrode 64.

Figure 7:
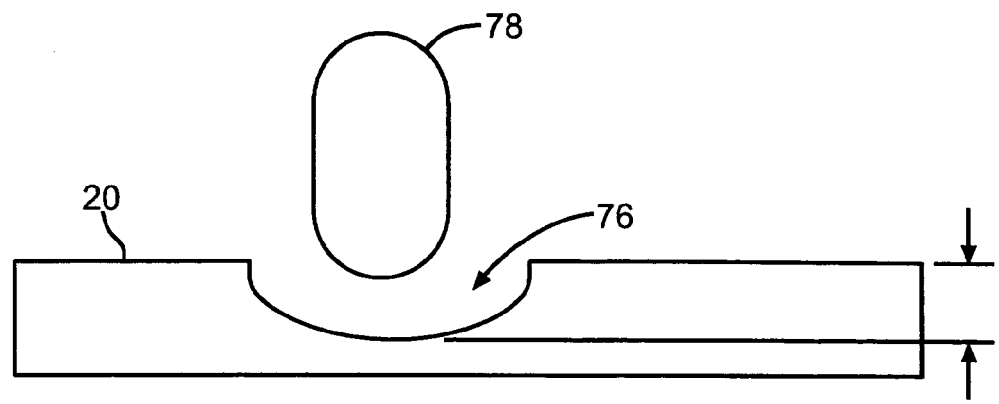
FIG. 7 is a diagrammatic representation of a sensing zone for the switch shown in FIG. 6.

The operation of the aforementioned switch 58 is best understood with reference to the diagrammatic representation in FIG. 7. In the drawing, there is illustrated a portion of the fascia 20 having a target area 76 within which a stimulus 78 is sensed. The stimulus 78 is via a touch input, such as an operator's finger. The instant invention is most suitably adapted for sensing a covered or gloved finger because of the three-dimensional separation between the electrodes 64, 68 (shown in FIG. 6). The sensitivity of the switch 58 may be adjustable by adjusting the external disturbance detected by the electrodes 64, 68. The switch 58 is not operated unless and until the stimulus 78 actually enters "into" the target area 76 and is in greater proximity to the first electrode 64 than the second electrode 68. In this way, the disturbance of the stimulus 78 must be detected by the first and second electrodes 64, 68 but, to a greater extent, by the first electrode 64 in order for the switch 58 to operate.

Figure 8:
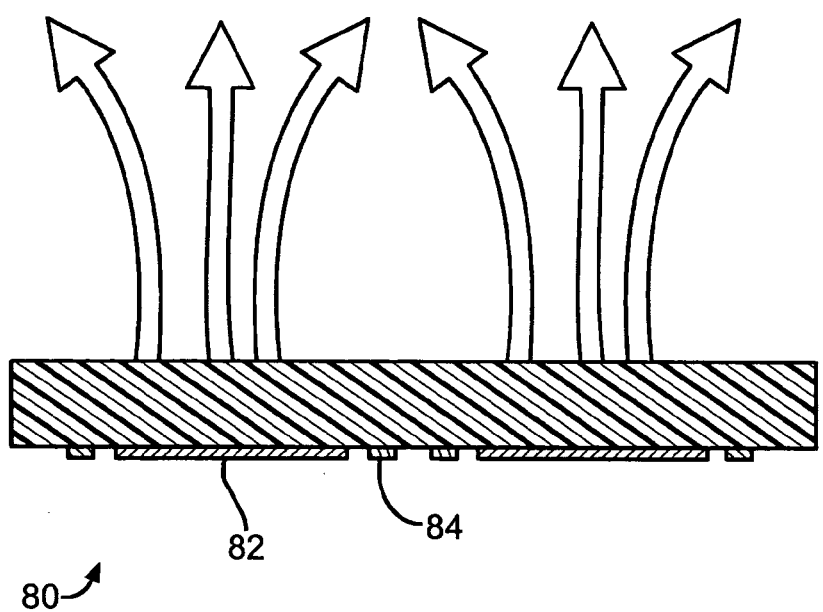
FIG. 8 is a diagrammatic representation in plan of another non-movable switch that is adapted for use with the motor vehicle center stack switch bank.

An alternative switch 80, similar to the switch 58 described above, is illustrated in FIG. 8. A switch suitable for this application is likewise described in the aforementioned U.S. patent application Publication. This switch 80 comprises a first electrode 82 and a second electrode 84 spaced from and surrounding the first electrode 82. Unlike the above-described switch 58, the electrodes 82, 84 of this switch 80 are oriented in the same plane. A signal is provided to the switch 80 to generate an electric field about the switch 80. Introduction of a stimulus, such as an operator's finger, near the switch 80 disturbs the electric field. A control circuit (not shown) detects disturbances in the electric field and generates a control signal in response. The control signal controls the operation of an electrically operated device of the motor vehicle.

Figure 9:
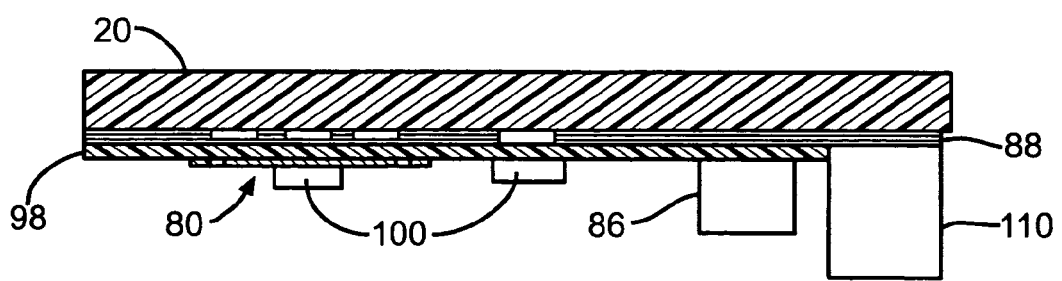
FIG. 9 is a partial cross-sectional view in plan of a motor vehicle center stack switch bank with the switch shown in FIG. 8 in combination with an audio driver assembly for providing audio and tactile sensations.

The switch bank 10 according to the present invention may have attached thereto an audio driver assembly 86, as shown in FIG. 9, for providing audible and/or tactile switch feedback. The fascia 20 of the switch bank 10 may be in the form of an acrylic, polycarbonate or other lightweight, high-performance material and is ideally a tough, durable, shatter-resistant, and heat-resistant material. The fascia 20 may be a relatively dark transparent or translucent material, such as a flat smoked polycarbonate material. The fascia 20 may be flat, as shown, or may have tactile features, such as those described above. An applique 88, which may include a plurality of layers, may be disposed behind or adjacent an inner surface of the fascia 20 (i.e., below the fascia 20 when viewing FIG. 9). The applique 88 may, for example, have an outermost dark translucent or transparent layer, such as a black layer, which is disposed in the foreground. An intermediate layer may be provided behind or adjacent the outermost layer (i.e., below the outermost layer when viewing FIG. 9). The outermost layer may be etched and the intermediate layer may be translucent and an intermediate color, such as gray, which preferably contrasts well with the color of the outermost layer to provide a visual indication of the location of the switch 80. In addition, the intermediate layer may be etched and an innermost layer may be provided behind or adjacent the intermediate layer in the background, or opposite the outermost layer (i.e., below the intermediate layer when viewing FIG. 9). The innermost layer may be a lighter color, such as white, which preferably contrasts well with the color of the intermediate layer. The intermediate layer may also be etched with a pattern representing a conventional or standard symbol. The lighter color of the innermost layer may be displayed through the etched intermediate layer. The layers may be paint layers, such as a black paint layer, a gray paint layer, and a diffused white paint layer.

Figure 10:
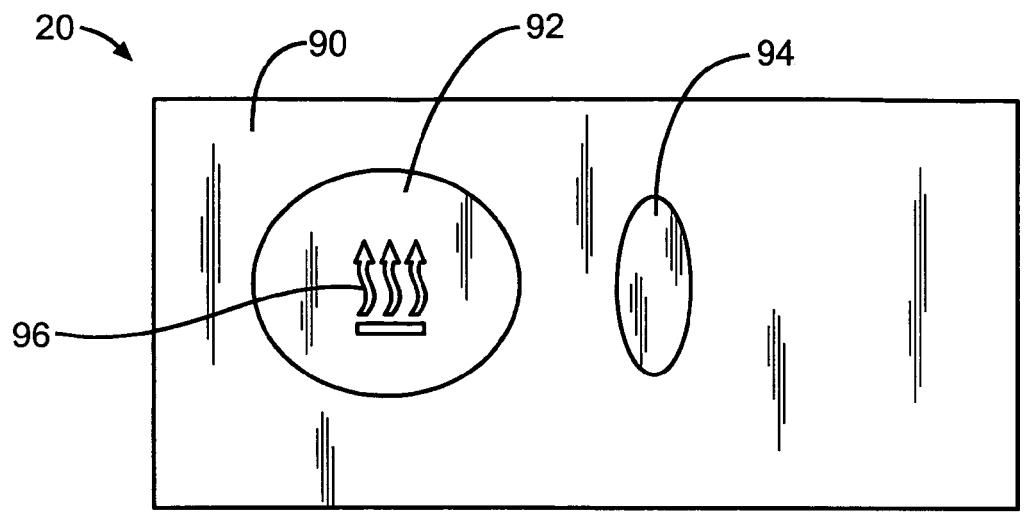
FIG. 10 is a front elevational view of the portion of the motor vehicle center stack shown in FIG. 9.
Figure 11:
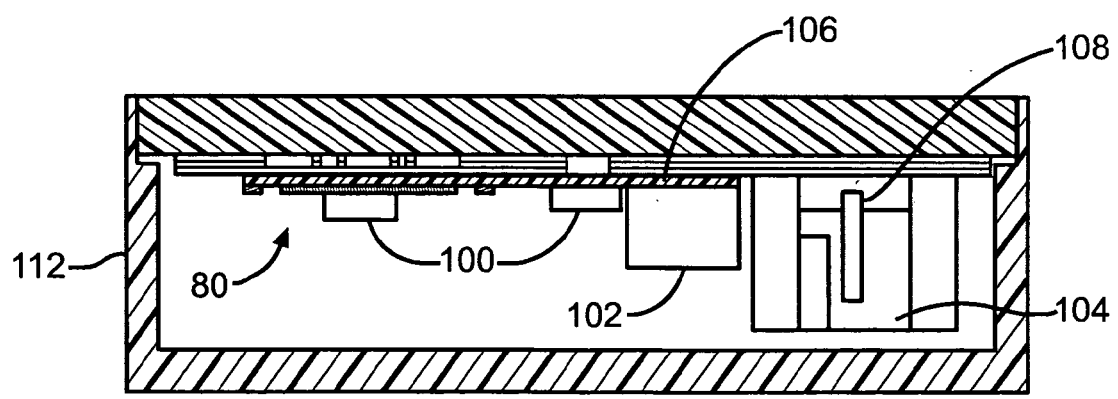
FIG. 11 is a partial cross-sectional view in plan of a motor vehicle center stack switch bank with the switch shown in FIG. 8 in combination with a tone generator and a tactile transducer for providing audible and tactile sensations.

An example of a smoked polycarbonate fascia 20 with an applique 88 as described above is illustrated in FIG. 10. The fascia 20 is generally indicated at 20. The dark outermost layer is indicated at 90. The outermost layer 90 may be etched to reveal the intermediate layer to indicate the location of a switch at 92 and optionally reveal a visual indicator at 94. The intermediate layer may be similarly etched to reveal the innermost layer to provide a visual indication (i.e., such as the rear defogger symbol shown) of the switch function at 96 and the visual indicator of the switch condition (i.e., actuation or de-actuation) at 94. It should be appreciated that a source of light 100, such as the LEDs shown in FIG. 9, may be located behind or in the background of the applique 88 for emitting light through the applique 88 and the fascia 20. This provides a visual indication of the location of a switch and the operable condition of the switch when the motor vehicle is operated in the dark.

In accordance with the present invention, the switch 80, the audio driver assembly 86, and the light source 100 may be supported by a flexible printed circuit board 98 that is located behind or adjacent the applique 88. The flexible printed circuit board 98 may conform tightly to the shape of the fascia 20, whether the fascia 20 is flat or has tactile features. Consequently, the audio driver assembly 86 may be located sufficiently close to the fascia 20 to produce a tactile sensation when operating the switch 80.

It should be understood that a tone generator 102 and a tactile transducer 104 may be used in addition to, or in place of, the audio driver assembly 86 described above to produce audible and/or tactile switch feedback. The tone generator 102 and the tactile transducer 104, together with the switch 80 and a light source 100, may similarly be supported by a flexible printed circuit board 106. The tone generator 102 may function to produce audible sensations, such as soft soothing tones, to provide an audible sensation when the switch 80 is operated. The tactile transducer 104 may be provide tactile sensations, such as clicking or thumping sensations, when the switch 80 is operated. The tactile transducer 104 may be in the form of a solenoid, which, when used in this application, may be referred to as a stamper or thumper. Upon operating the switch 80, the solenoid may be energized to displace a plunger, such as indicated at 108, which may tap, thump, vibrate, or otherwise cause a tactile sensation through the switch bank 10.

It should be appreciated by one of ordinary skill in the art of the invention that various components of the invention may be programmable. For example, as stated above, the sensitivity of the switches 58 and 80 may be adjusted to accommodate the tactile features, or lack thereof, in the fascia 20. The intensity of the light source 100 may be programmed as desired. The frequency of the audio driver assembly 86 may be programmed to control the audible and tactile sensations produced therewith. For example, higher frequency signals could be produced by the audio driver assembly 86 to produce audible sensations while lower frequency signals could be produced by the audio driver assembly 86 to produce tactile sensations. Both high and low frequency signals can be produced to produce both audible and tactile sensations. These programmable features may be achieved by a controller, such as a microcontroller or processor, as indicated at 110 in FIG. 9, and instructions in memory accessed by the controller 110. The controller and suitable control circuitry may be supported by or otherwise connected to the printed circuit board 72, 98, 106 to control the operation of the switch 58, 80, the light source 100, the audio driver assembly 86, the tone generator 102, and the tactile transducer 104. The control circuitry may include individual latching switches for toggling individual light sources 100 and triggering the audio driver assembly 86, the tone generator 102, and the tactile transducer 104 to produce audible and tactile sensations when the switch 58, 80 is operated. Alternatively, the audio driver assembly 86, the tone generator 102, and the tactile transducer 104 may have an integral controller or control circuitry to control the operation thereof independently.

It should further be appreciated by one of ordinary skill in the art that the audio driver assembly 86, in addition to producing audible sensations, may also function as a center speaker for the motor vehicle.

In accordance with a preferred embodiment of the invention, the switches, the light sources 100, the audio driver assembly 86, the tone generator 102, and the tactile transducer 104 are contained within a box or housing 112 so as to be a self-contained unit. The entire housing 112 is preferably very small or thin and simple to remove from the center stack.

Through the use of mechanical or non-moving touch pads or switches, multiple parts and motion can be eliminated. The elimination of motion permits the elimination of gaps, which would otherwise be provided between the moving parts. Through the elimination of gaps, the appearance of the center stack is improved, as is the cleanability of the center stack and the environmental protection afforded by the center stack.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A switch bank for a motor vehicle, the switch bank comprising:
   a motor vehicle interior trim component; and
   at least one non-movable dedicated switch located behind the interior trim component, wherein the switch is operable to actuate and de-actuate an electrically operated device of the motor vehicle, wherein the switch is a capacitive switch including two or more independent dielectric substances, a first one of the dielectric substances having a first electrode and a second one of the dielectric substances having a second electrode, the first and second electrodes having a three-dimensional separation therebetween, the first and second electrodes forming background capacitive sensors for detecting external disturbance by a stimulus, the second electrode having a greater coupling to the external disturbance than the first electrode, and wherein the switch is non-reconfigurable.

2. The switch bank of claim 1, wherein the interior trim component is molded and has no openings at least where switches are located.

3. The switch bank of claim 1, wherein the interior trim component has tactile features to permit a user to easily identify the location of the switch via tactile sensations.

4. The switch bank of claim 1, wherein the interior trim component has a target area associated with a sensitive operating region of the switch.

5. The switch bank of claim 1 wherein the interior trim component is at least partially transparent or translucent and back-lit to enable a user to visually identify the location of the switch.

6. The switch bank of claim 1, wherein the switch carries indicia that allows a user to associate the switch with the electrically operated device that the switch controls.

7. The switch bank of claim 1, wherein the switch is one of either a resistive, inductive, piezoelectric or capacitive switch.

8. The switch bank of claim 1, wherein the switch is a capacitive switch including at least one dielectric substance and at least one electrode for sensing external disturbance by a stimulus.

9. The switch bank of claim 1, further comprising an audio driver assembly located behind the interior trim component for producing an audio sensation that provides feedback to a user identifying a switch operation.

10. The switch bank of claim 1, further comprising an audio driver assembly located behind the interior trim component and sufficiently close to the interior trim component to produce a tactile sensation when the switch is operated.

11. The switch bank of claim 1, wherein the switch is supported on a flexible printed circuit board that is located behind the interior trim component and which conforms to the shape of the interior trim component.

12. The switch bank of claim 1, further comprising a tone generator located behind the interior trim component for producing an audible sensation when the switch is operated.

13. The switch bank of claim 1, further comprising a tactile transducer located behind the interior trim component for producing a tactile sensation when the switch is operated.

14. The switch bank of claim 13, wherein the tactile transducer is in the form of a solenoid that is adapted to be energized to displace a plunger that engages the interior trim component when the switch is operated.

15. The switch bank of claim 1, further comprising an audio driver assembly located behind the interior trim component for providing a switch sensation feedback when the switch is operated, wherein the sensitivity of the switch sensation feedback is adjustable.

16. The switch bank of claim 1, wherein the switch bank is integrated with a motor vehicle center stack so that the interior trim component and the center stack are molded in a single piece having unitary construction.

17. A switch bank for a motor vehicle, the switch bank comprising:
   a motor vehicle interior trim component; and
   at least one non-movable dedicated switch located behind the interior trim component, wherein the switch is operable to actuate and de-actuate an electrically operated device of the motor vehicle, wherein the switch is a capacitive switch including a first electrode and a second electrode spaced from and surrounding the first electrode so as to be oriented in the same plane, whereby the switch is adapted to generate an electric field that is subject to disturbance by a stimulus, the disturbance being detected by a control circuit, which generates a control signal that controls the operation of the electrically operated device, and wherein the switch is non-reconfigurable.

18. A switch bank for a motor vehicle, the switch bank comprising:
  a motor vehicle interior trim component; and
  at least one non-movable dedicated switch located behind the interior trim component, wherein the switch is operable to actuate and de-actuate an electrically operated device of the motor vehicle, further comprising an audio driver assembly that is programmable to operate at different frequencies to produce audio or tactile sensations, and wherein the switch is non-reconfigurable.

19. The switch bank of claim 18, wherein the audio driver assembly also functions as a center speaker for the motor vehicle.

* * * * *